(12) United States Patent
Harrison et al.

(10) Patent No.: US 11,159,162 B2
(45) Date of Patent: Oct. 26, 2021

(54) CAMERA CONTROL KEY

(71) Applicant: PLR IP Holdings, LLC, Minnetonka, MN (US)

(72) Inventors: Craig Harrison, Deerfield, IL (US); Rodrigo Flores, Elgin, IL (US); Jason Gebhardt, Buffalo Grove, IL (US)

(73) Assignee: PLR IP HOLDINGS, LLC, Minnetonka, MN (US)

( * ) Notice: Subject to any disclaimer, the term of this patent is extended or adjusted under 35 U.S.C. 154(b) by 238 days.

(21) Appl. No.: 16/600,767

(22) Filed: Oct. 14, 2019

(65) Prior Publication Data

US 2021/0111719 A1    Apr. 15, 2021

(51) Int. Cl.
*H03K 17/96* (2006.01)
*G06F 3/0488* (2013.01)
*G06F 3/0354* (2013.01)
*G06F 3/044* (2006.01)

(52) U.S. Cl.
CPC ..... *H03K 17/9622* (2013.01); *G06F 3/03547* (2013.01); *G06F 3/044* (2013.01); *G06F 3/04883* (2013.01)

(58) Field of Classification Search
CPC . H03K 17/9622; G06F 3/03547; G06F 3/044; G06F 3/04883
See application file for complete search history.

(56) References Cited

U.S. PATENT DOCUMENTS

| | | | |
|---|---|---|---|
| 7,535,799 B2 | 5/2009 | Polany | |
| 7,789,228 B2 | 9/2010 | Zenzai | |
| 8,158,899 B2 | 4/2012 | Bloch | |
| 9,170,690 B2 | 10/2015 | Chu | |
| 9,491,336 B2 | 11/2016 | Hsiang | |
| 9,742,977 B2 | 8/2017 | Howard | |
| 10,067,671 B2 | 9/2018 | Adderly | |
| 10,122,914 B2 | 11/2018 | Steinberg | |
| 2008/0246741 A1* | 10/2008 | Hinata | G06F 1/1643 345/173 |

(Continued)

FOREIGN PATENT DOCUMENTS

WO    WO2017035637 A1    3/2017

OTHER PUBLICATIONS

Campark X20 4K Action Camera 20MP with EIS Touch Screen Remote Control Waterproof Camera https://www.amazon.com/Campark-X20-Waterproof-Underwater-Camcorder/dp/B07556SJP4 (last accessed Jun. 30, 2020).

*Primary Examiner* — Kyung S Lee
(74) *Attorney, Agent, or Firm* — Bishop, Diehl & Lee, Ltd.

(57) ABSTRACT

A camera control key assembly including a metal housing with a pocket containing a sensor window, a metal strip abutting a side of the sensor window, a spacer positioned to abut the metal strip, at least one capacitive touch sensor abutting the spacer, and a control key set into the pocket of the housing and contacting a first side of the sensor window. Preferably, the plastic sensor window is insert molded into the metal housing making the assembly inherently watertight. The assembly comprises at least one force concentrator on the control key to act upon the sensor window which in turn allows the capacitive touch sensor to register a multitude of different user inputs, including pressure, varied pressure, duration, taps, slides and swipes.

24 Claims, 4 Drawing Sheets

(56) References Cited

U.S. PATENT DOCUMENTS

| | | | |
|---|---|---|---|
| 2009/0139329 A1* | 6/2009 | Shinogi | G01P 15/135 |
| | | | 73/514.09 |
| 2010/0046179 A1* | 2/2010 | Arita | G06F 1/1647 |
| | | | 361/752 |
| 2010/0053854 A1* | 3/2010 | Nishikawa | G06F 3/041 |
| | | | 361/679.01 |
| 2010/0176476 A1* | 7/2010 | Takayama | B26D 3/06 |
| | | | 257/432 |
| 2012/0256867 A1* | 10/2012 | Annacone | G06F 3/044 |
| | | | 345/174 |
| 2013/0127778 A1 | 5/2013 | Liu | |
| 2014/0021863 A1* | 1/2014 | Bertrand | G06F 3/0304 |
| | | | 315/129 |
| 2016/0286920 A1 | 10/2016 | Lean | |
| 2016/0291731 A1 | 10/2016 | Liu | |
| 2017/0324890 A1 | 11/2017 | Moskovchenko | |
| 2018/0004342 A1* | 1/2018 | Lee | G06F 3/0227 |
| 2018/0088443 A1 | 3/2018 | Riddiford | |
| 2018/0157411 A1* | 6/2018 | Kim | G06F 3/044 |

\* cited by examiner

CAMERA CONTROL KEY

TECHNICAL FIELD OF THE INVENTION

The present invention relates to camera control keys. More specifically, the invention relates to a watertight control key with no moving parts which allows multiple different user inputs.

BACKGROUND OF THE INVENTION

A primary function of a camera is to capture an image either on film or a digital storage medium. Regardless of the type of camera being used, the process of taking a picture is typically actuated by what is known as a camera key or a shutter key. The camera or shutter key comes in several types, depending on the camera, and each of these types has its advantages and disadvantages.

A "mechanical shutter key," found in older and less expensive cameras, is commonly comprised of a push-button actuator which, when depressed, through a series of mechanical linkages, actuates a camera shutter to open and close. While the camera shutter can be set for different performances, the shutter key only has the function of triggering the shutter to open.

An "electromechanical button" is also a common implementation of the camera shutter key. Examples of electromechanical buttons include tactile buttons and dome switches. In use, the user applies force to the button to create mechanical motion which then moves an electric contact to a position that completes an electric circuit. The completion of the circuit, as with the mechanical shutter key above, actuates the camera shutter to open.

Newer and more expensive cameras often employ "capacitive touch sensors." These are less common as shutter keys but are frequently used as control buttons for other devices. A capacitive touch sensor is positioned behind a dielectric panel. The capacitive touch sensor excites an electromagnetic field between two electrodes and monitors the capacitance between the two electrodes. When a user places a finger against the opposite side of the dielectric plate it disrupts the generated electromagnetic field by causing a measurable change in the capacitance being monitored. A control subsystem identifies this change and activates a preprogrammed command.

Finally, "capacitive touch buttons" are less commonly used for camera shutter keys and combine features of the electromechanical button and the capacitive touch sensor. While a capacitive touch sensor operates when a user's finger disrupts a monitored electromagnetic field, the actuation of a capacitive touch button is accomplished by a surface, called a target, which is moved into and disrupts the monitored electromagnetic field. Commonly, capacitive touch buttons use a membrane or flexible elastic surface as the target. In use, the user applies force to a capacitive touch button target to create a mechanical motion which moves the button closer to a sensor. The sensor detects this motion through a measurable change in the electromagnetic field due to the change in button position.

The above mechanisms have several drawbacks when used as a camera key. For example, existing embodiments require some force and physical motion from the user to actuate a camera key. This physical action causes the device to move in the instant that a picture is being taken. Such motion may cause measurable negative effects to picture quality. There is also the issue with capacitive touch sensors which cannot be consistently actuated when the user is wearing gloves. This can be mitigated by utilizing a flexible membrane style capacitive touch button, but the membrane switch must be pliable to allow deflection of the button surface. In order to provide the proper room for such deflection, an air gap is required where the button surface deflection is detected by the capacitive sensor. This can make for a deeper "stack up" of materials that inhibits and limits miniaturization. Mechanical and electromechanical (membrane capacitive, bubble, dome, tactile) switches all require significant mechanical movement of a button to actuate a switch. This requires the button housing and button to be individual parts and in the case of mechanical switches, or electromechanical switches, this can create water sealing requirements. Membrane, bubble, dome and tactile switches are more easily sealed, but they all require a flexible soft touch surface. Over time, the flexible surface can wear out and is subject to damage from use. As a result, mechanical durability and aesthetic value are compromised when the button and button housing are required to be separate parts.

Further, buttons with multiple inputs are generally comprised of two or more individual buttons ganged together. In particular, when employing metal-piezo buttons it is difficult to combine multiple sensors to one solid button surface. Accordingly, multiple buttons are required.

Piezo buttons can be sealed in metal with a metal touch surface, but piezo transducers used as switches can only register short, momentary inputs. For this reason, they are not suitable for static force (i.e., press and hold) or dynamic force (i.e., light press to hard press) inputs. Miniaturization is difficult with piezo transducers because they rely on the deflection of a ceramic sheet. As the sheet is miniaturized, additional force is required for the same signal for actuation, and it becomes difficult to measure when the sensor is triggered.

Until the invention of the present application, these and other problems in the prior art went either unnoticed or unsolved by those skilled in the art. The present invention provides a shutter key capable of accepting a multitude of user inputs to a single surface which can be used to control a camera's operation. The key is capable of perform multiple functions with the associated camera device without sacrificing design, style or affordability.

SUMMARY OF THE INVENTION

There is disclosed herein an improved control key assembly for a camera which avoids the disadvantages of prior devices while affording additional structural and operating advantages.

A camera control key assembly with a watertight all metal exterior and no moving parts that allows a user to input a multitude of commands to a camera device is provided.

Generally speaking, the disclosed assembly includes a metal housing with a pocket containing sensor window, a metal strip abutting a second side of the sensor window, a spacer positioned to abut the metal strip, at least one capacitive touch sensor abutting the spacer, and a control key set into the pocket of the housing and contacting a first side of the sensor window.

Preferably, the plastic sensor window is insert molded into the metal housing making the assembly inherently watertight.

In specific embodiments, the assembly comprises a plurality of force concentrators on the control key, wherein the number of force concentrators is the same as the number of capacitive touch sensors. Accordingly, each force concentrator contacting the first side of the sensor window aligns with a capacitive touch sensor on the other side of the sensor window.

In specific embodiments, the control key(s) includes a force concentrator that acts upon the sensor windows which in turn allows the capacitive touch sensors to register a multitude of different user inputs, including pressure, varied pressure, duration, taps, slides and swipes.

These and other aspects of the invention may be understood more readily from the following description and the appended drawings.

BRIEF DESCRIPTION OF THE DRAWINGS

For the purpose of facilitating an understanding of the subject matter sought to be protected, there are illustrated in the accompanying drawings, embodiments thereof, from an inspection of which, when considered in connection with the following description, the subject matter sought to be protected, its construction and operation, and many of its advantages should be readily understood and appreciated.

DETAILED DESCRIPTION OF THE INVENTION

Figure 1:
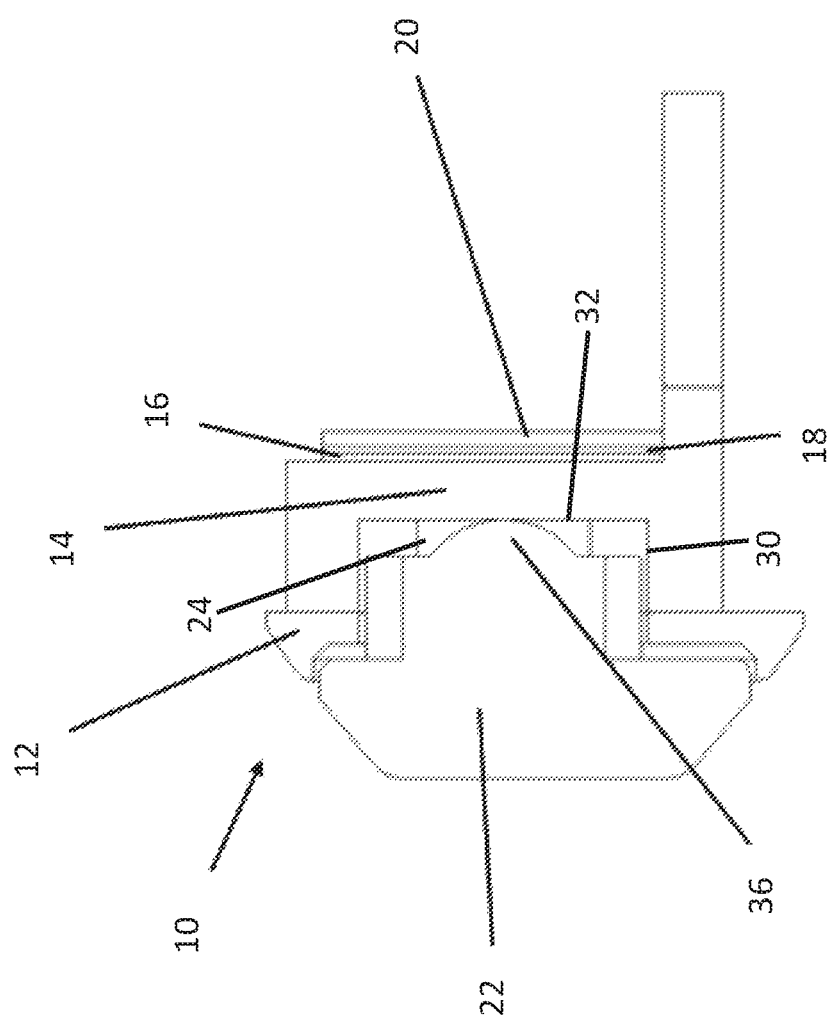
FIG. 1 is a schematic side view of an embodiment of the disclosed control key assembly.
Figure 2:
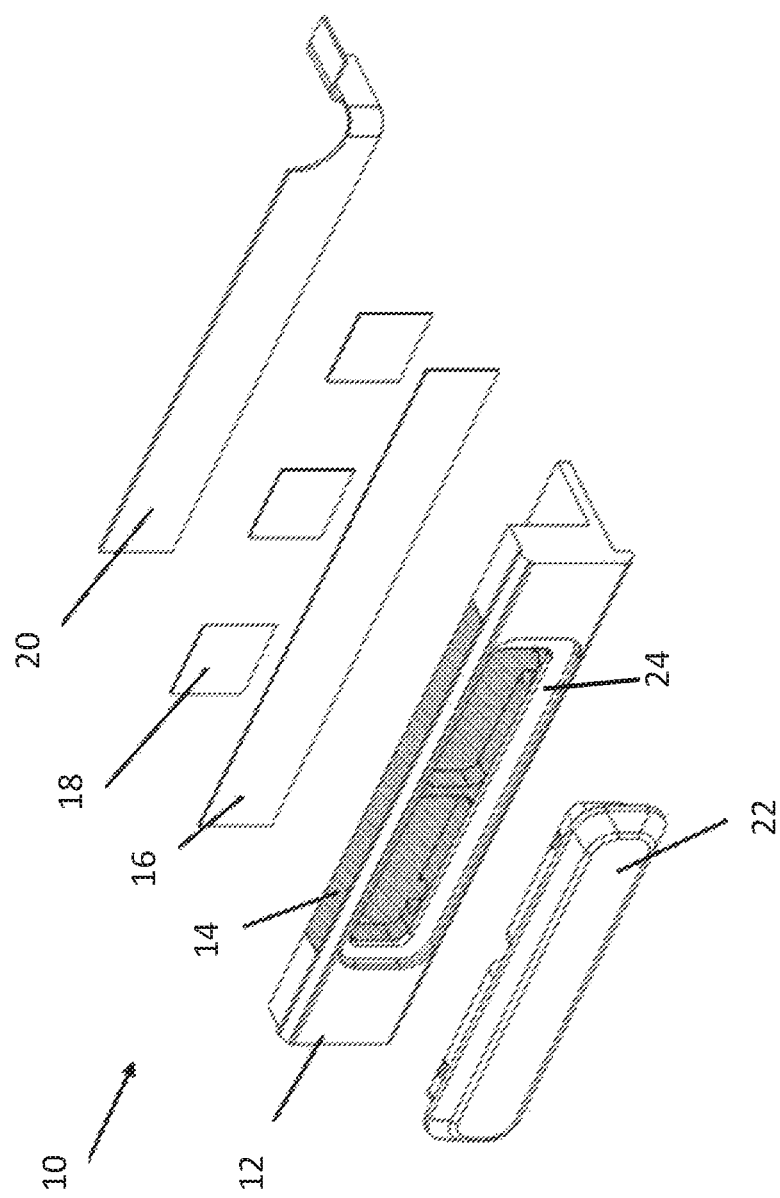
FIG. 2 is a front exploded view of the embodiment of FIG. 1.
Figure 3:
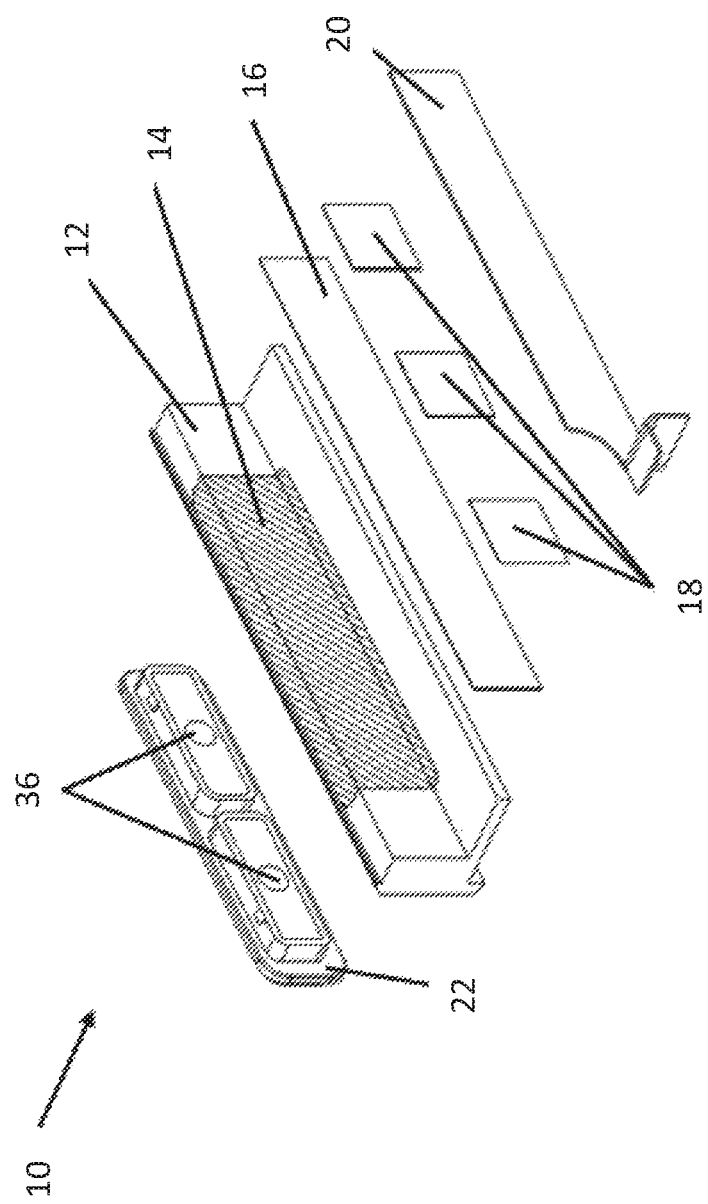
FIG. 3 is a rear exploded view of the embodiment of FIG. 1.

While this invention is susceptible of embodiments in many different forms, there is shown in the drawings and will herein be described in detail at least one preferred embodiment of the invention with the understanding that the present disclosure is to be considered as an exemplification of the principles of the invention and is not intended to limit the broad aspect of the invention to any of the specific embodiments illustrated.

Referring to FIGS. 1-4, there is illustrated embodiments of a control key assembly, generally designated by the numeral 10. The particular illustrated control key assembly 10 is for a camera. While all the embodiments illustrated are directed to a control key for a camera, it should be understood that the principles of the invention can be more broadly applied to other electronic devices, such as smart phones, computers, tablets, and the like, as long as a control button/key is required.

The disclosed control key assembly 10 is an enhanced shutter key capable of accepting a multitude of user inputs to a single surface to control a camera's operation. The possible user inputs include taps and swipes, varied tap pressure, and tap duration. Further, the camera control key surface and key housing are comprised of solid metal, not requiring a spring return or mechanical motion.

A first embodiment of the disclosed control key assembly 10 is a rugged low-profile button capable of multiple inputs for use as a camera control key. As shown in FIG. 1, the control key assembly 10 is comprised of a housing 12, a sensor window 14, a spacer 18 positioned between a metal strip 16 and a capacitive touch sensor 20, a control key 22 set into a pocket 24 of the housing 12 and contacting a first side 26 of the sensor window 14. The pocket 24 of the housing 12 has an interior surface 30 and a base 32. The sensor window 14 is molded into the base 32 of the housing 12 with a first side open to the interior of the pocket 24 and a second side opposite the first. The control key 22 is in contact with the first side of the sensor window 14 via a force concentrator 36.

Additionally, the construction of the camera control key assembly 10 results in a watertight and very low-profile device. The camera key assembly 10, having no moving parts has a reduced undesired movement at the instant a picture is taken.

The housing 12 is preferably comprised of metal, such as stainless steel, or another sufficiently rigid material. The housing 12 has an exterior surface and an interior surface, including base 32. As previously described, the housing 12 includes a pocket 24 which is either molded, cut or otherwise formed to provide a recessed area. The pocket 24 is defined by surfaces of the housing 12, including the base 32. At the base 32 the sensor window 14 is molded of a rigid plastic. Preferably, the sensor window 14 is insert-molded into the base 32 to further facilitate the watertight feature of the housing 12. That is, to prevent water from passing through the base 32 of the housing 12 into the interior of the electronic device (e.g., camera).

Behind the sensor window 14, on the interior watertight side of the housing 12 is positioned a thin metal strip 16. The strip 16 is aligned flat with no gaps against the opposite or second side of the sensor window 14—i.e., opposite the first side of the base 32. Preferred embodiments include an adhesive to retain the metal strip 16 against the sensor window 14, though other suitable mechanical means to hold the metal strip 16 in place are known to those of skill in the art.

A spacer 18 is then positioned adjacent to the thin metal strip 16. The spacer 18 is positioned flat with no gaps against the metal strip 16. Preferred embodiments include an adhesive backed spacer 18 or suitable mechanical features to hold the spacer 18 against the metal strip 16.

Finally, behind the spacer 18 a capacitive touch sensor 20 is positioned. The sensor 20 is also positioned flat with no gaps against the spacer 18. Preferred embodiments include the use of an adhesive material or mechanical fasteners to hold the sensor 20 against the spacer 18.

Returning to the housing 12, the metal control key 22 is positioned in the pocket 24. The control key 22 is preferably sized such that there is no gap between the side surfaces of the pocket 24 and the side surfaces of the key 22. Preferably, the key 22 and the housing 12 should visually appear to be a solid, single mass. When installed the camera key 22 has no mechanical motion. While the upper/outer surface of the camera key 22 is preferably flat and smooth, it may also be contoured with physical patterns, textures or stylized designs.

The control key 22 includes the force concentrator 36, which contacts the first side 32 of the sensor window 14. The concentrator 36 preferably has a semi-spherical shape so that only the apex of the surface contacts the sensor window 14. The purpose of the concentrator 36 is to focus a force or pressure from the key 22 onto the sensor window 14 at the contact point. As constructed in FIG. 1, when a minor amount of force or pressure is applied by a user to the key 22, minor stress is placed on the sensor window 14, which causes minor deflection of the metal strip 16, which is sensed by the capacitive touch sensor 20.

In a preferred embodiment, the assembly 10 comprises an elongated key 22 with corresponding elongated internal components. This is shown best in FIGS. 2 and 3. Specifically, the control key 22 includes a plurality of concentrators 36 each of which contacts the sensor window 14 molded into the base 32 of the pocket 24. As shown best in FIG. 3, the specific control key 22 includes two concentrators 36. The assembly also includes a plurality of spacers 18 arranged laterally along the metal strip 16.

A single capacitive touch sensor can accept a variety of user inputs. The touch inputs can vary based on touch force, a change in touch force, touch and force duration, and number of touches (i.e., counting taps). Accordingly, user commands for operation of the electronic device (e.g., camera) could be defined by these varied inputs or any combination of the user inputs.

Figure 4:
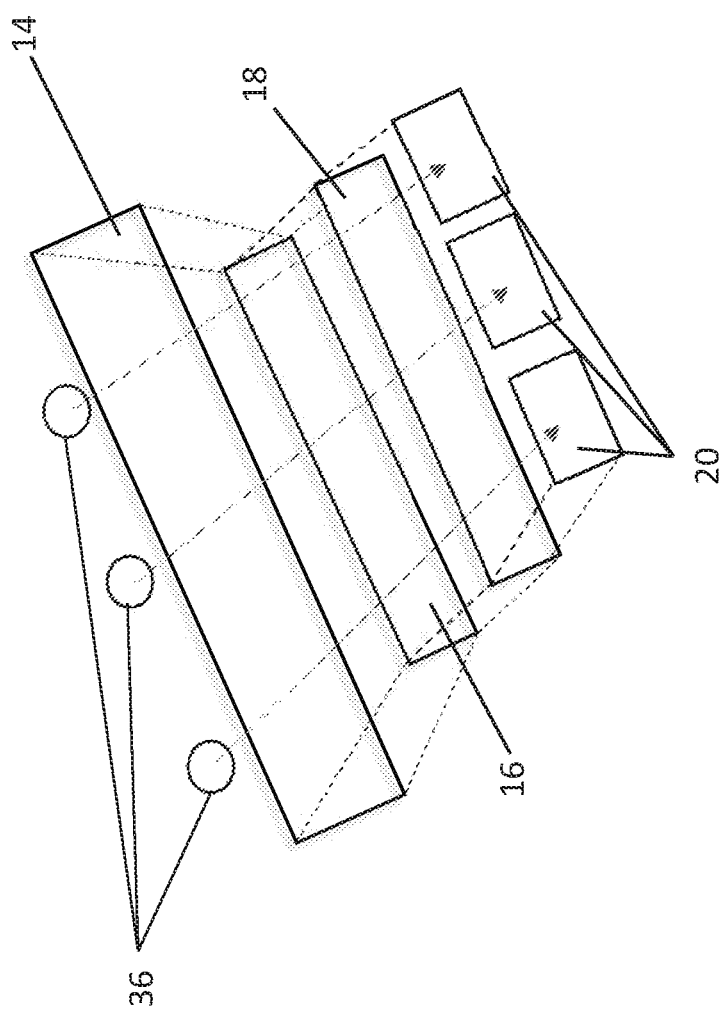
FIG. 4 is a schematic of a second embodiment of the disclosed control key assembly.

An alternative embodiment, as schematically illustrated in FIG. 4, could include multiple capacitive touch sensors 20. This could be implemented with notable accommodations. The control key 22 would need to have at least one stress concentrator 36 (as represented by the circles) for each sensor 20. The sensor window 14 would have to be large enough such that the surface of every sensor 20 could align with a concentrator 36 through the sensor window 14. The dashed arrows show the transfer of stress/pressure from each concentrator 36 through the metal strip 16, through the spacer 18 and ultimately to each of the corresponding sensors 20. Each of the sensors 20 then registers the pressure as a "touch" of a specific duration and/or force.

Generally speaking, the use of multiple sensors allows a single control key to accept more varied user inputs than is possible using a single sensor. Each of the multiple sensors 20 can accept the same inputs of touch force, a change in touch force, touch and force duration and number of touches (i.e., taps). However, a user could also apply these inputs over different locations on the control key 22. Each sensor 20 could measure its inputs individually resulting in an ability for the user to input more complex commands. For example, a notable input requiring multiple sensors would be a swipe command where a user drags a finger across the control key 22 while applying some force.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of applicants' contribution. The actual scope of the protection sought is intended to be defined in the following claims when viewed in their proper perspective based on the prior art.

What is claimed is:

1. A control key assembly for a camera, the assembly comprising:
a housing having an outer surface with a pocket defined therein, the pocket having an interior surface and a base;
a sensor window positioned in the base and having a first side open to the interior of the pocket and a second side opposite the first side;
a metal strip abutting the second side of the sensor window;
a spacer abutting the metal strip;
a capacitive touch sensor abutting the spacer; and
a control key set into the pocket of the housing and contacting the first side of the sensor window.

2. The control key assembly of claim 1, further comprising a watertight seal formed between the sensor window and the housing.

3. The control key assembly of claim 2, wherein the watertight seal comprises the sensor window insert molded to the housing.

4. The control key assembly of claim 2, further comprising a zero-clearance between the control key and pocket.

5. The control key assembly of claim 1, further comprising a plurality of capacitive touch sensors spaced laterally and abutting the spacer.

6. The control key assembly of claim 5, wherein the control key comprises a plurality of force concentrators each of which independently concentrates force onto the first surface of the sensor window when the control key is pressed.

7. The control key assembly of claim 6, wherein the plurality of capacitive touch sensors, the control key, and the plurality of force concentrator are arranged to allow the sensing of user inputs including at least one of:
number of touches;
time of a touch;
duration of a touch;
force of a touch; and
change of force of touches by a user.

8. The control key assembly of claim 6, wherein the number of force concentrators is the same as the number of capacitive touch sensors.

9. The control key assembly of claim 8, wherein each force concentrator contacting the first side of the sensor window aligns with a capacitive touch sensor.

10. The control key assembly of claim 1, wherein the control key is comprised of solid metal.

11. The control key assembly of claim 10, wherein the control key comprises a force concentrator which concentrates force onto the first surface of the sensor window when the control key is touched by a user.

12. The control key assembly of claim 11, wherein the plurality of capacitive touch sensors, the control key, and the force concentrator are arranged to allow the sensing of user inputs including at least one of:
number of touches;
time of a touch;
duration of a touch;
force of a touch; and
change of force of touches by a user.

13. The control key assembly of claim 1, wherein the control key comprises a contoured upper surface.

14. The control key assembly of claim 1, wherein the control key comprises a textured upper surface.

15. A control key assembly for a camera, the assembly comprising:
a housing having an outer surface with a pocket defined therein, the pocket having an interior surface and a base;
a sensor window positioned in the base and having a first side open to the interior of the pocket and a second side opposite the first side;
a metal strip abutting the second side of the sensor window;
a spacer positioned to abut the metal strip;
a plurality of capacitive touch sensors positioned laterally with each abutting the spacer; and
a control key set into the pocket of the housing and contacting the first side of the sensor window.

16. The control key assembly of claim 15, further comprising a watertight seal formed between the sensor window and the housing.

17. The control key assembly of claim 15, wherein the control key is comprised of solid metal.

18. The control key assembly of claim 15, wherein e control key comprises a plurality, of force concentrators each of which independently concentrates force onto the first surface of the sensor window when the control key is pressed.

19. The control key assembly of claim 18, wherein the plurality of capacitive touch sensors, the control key, and the plurality of force concentrators are arranged to all OW the sensing of user inputs including at least one of:
- number of touches;
- time of a touch;
- duration of a touch;
- force of a touch; and
- change of force of touches by a user.

20. The control key assembly of claim 18, wherein the number of force concentrators is the same as the number of capacitive touch sensors.

21. The control key assembly of claim 20, wherein each force concentrator contacting the first side of the sensor window aligns with a capacitive touch sensor.

22. The control key assembly of claim 15, further comprising a zero-clearance between the control key and pocket.

23. The control key assembly of claim 15, wherein the control key comprises a contoured upper surface.

24. The control key assembly of claim 15, wherein the control key comprises a textured upper surface.

* * * * *